METHOD OF OPERATING THERMOELECTRIC COOLING UNIT

Filed June 12, 1961

INVENTOR.
JULIUS B. HORVAY
BY Walter E. Rule
HIS ATTORNEY

United States Patent Office 3,070,964

Patented Jan. 1, 1963

3,070,964

METHOD OF OPERATING THERMOELECTRIC COOLING UNIT

Julius B. Horvay, Louisville, Ky., assignor to General Electric Company, a corporation of New York Filed June 12, 1961, Ser. No. 116,541

2 Claims. (Cl. 62—3)

Figure 1:
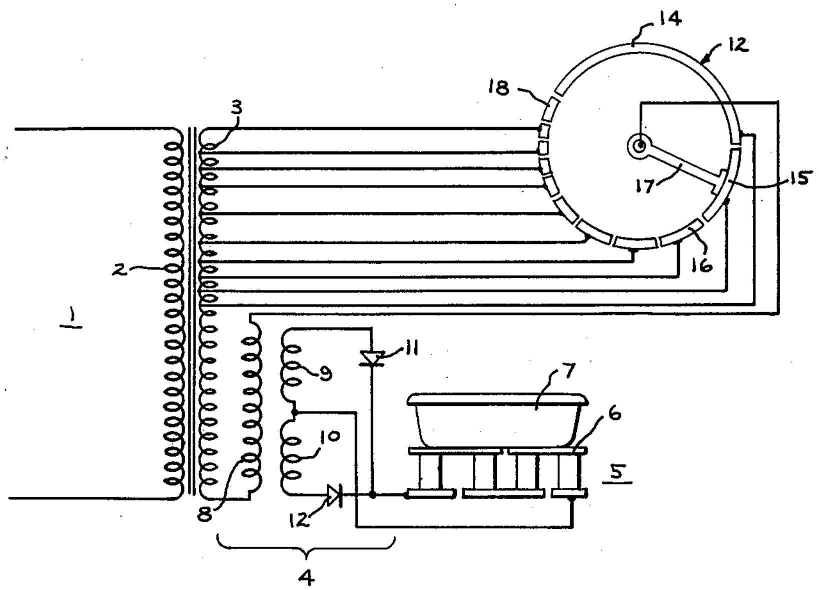

The present invention relates to thermoelectric cooling device and is more particularly concerned with a method of operating such a device to obtain, for a period of time, a lower cold junction temperature than is continuously obtainable with a thermoelectric element of a given design.

A thermoelectric cooling unit comprises a plurality of thermoelectric elements or thermocouples composed of series-connected metals or materials having dissimilar thermoelectric properties. When an electric current is passed through the elements, one of the junctions thereof becomes colder and the other warmer. In the application of devices of this type for refrigeration, the elements are arranged with the cold junctions in heat absorbing relationship with a surface or compartment to be cooled and the warm junctions in heat dissipating relationship with the ambient.

The actual temperature obtainable at the cold junction of a thermoelectric element, or more specifically the temperature differential between the hot and cold junctions of the element, is dependent upon a number of factors including the Peltier coefficient of the dissimilar materials comprising the elements, their heat conductivities and their resistances to the flow of electric current. Each pair of dissimilar materials A and B comprising a thermoelectric element is characterized by a Peltier coefficient which is a measure of the energy absorbed or discharged per unit of electric charge passing through the junction between these materials. The Peltier heat absorbed at the cold junction in a circuit where there is a current of I amperes is $\alpha_A-\alpha_B\ T_cI$ Joules per second where $T_c$ is the temperature of the cold junction and $\alpha_A-\alpha_B$ is the thermoelectric power of the junction. Similarly the Peltier heat energy released at the hot junction is $\alpha_A-\alpha_B\ T_hI$ Joules per second.

Actually the net cooling power of the cold junction is less than $\alpha_A-\alpha_B\ T_cI$ due to the heat conducted from the hot junction to the cold junction and the heat generated by the current flowing through the element. The amount of heat conducted from the hot junction to the cold junction through the materials of the thermocouple is dependent upon the thermal conductance of the thermocouple or thermoelectric element arms and the difference in temperature between the hot and cold junctions while the heat generated by the current in the arms of the element or couple is proportionate to the series resistance of the arms and the square of the current.

The temperature difference $T_h-T_c$ across the hot and cold junctions of a thermocouple can be given by the known equation $$(1)\qquad T_h-T_c=\frac{(\alpha_A-\alpha_B)T_cI-\frac{1}{2}I^2R-Q_0}{K}$$

where $\alpha_A$ and $\alpha_B$ are the thermal E.M.F. coefficients of the couple, I is the applied current, R is the electrical resistance of the thermocouple arms, K is the thermal conductance of the thermocouple arms and $Q_0$ is the heat transferred from the surroundings to the cold junction.

The above equation can be rewritten as—

$$(2)\qquad T_c=T_h-\frac{(\alpha_A-\alpha_B)T_cI-\frac{1}{2}I^2R-Q_0}{K}$$

It is also well known that for any thermoelement or thermocouple, there is an optimum direct current value that will give the lowest continuously attainable cold junction temperature. If the applied power is less than the optimum, full advantage is not taken of the thermoelectric power of the element or couple. If the applied power is larger than the optimum current, the overall cooling will be less because the heat generated by the $I^2R$ loss more than offsets the increase in the Peltier cooling resulting from the increased current. Also as the hot junction is warmer, an increased amount of heat flows from the hot to the cold junction. When a current higher than optimum is continuously passed through a thermoelectric element, there is an initial temperature drop at the cold junction at a more rapid rate than that obtained with the optimum current but the ultimate temperature is higher because of the higher hot junction temperature and hence a greater heat conductance from that junction to the cold junction and the higher $I^2R$ losses. The net result is that with a higher than optimum current, the steady state cold junction temperature is higher than that obtained with the optimum current.

The present invention has as its principal object the provision of a method of operating a thermoelectric element whereby there can be obtained for a period of time a cold junction temperature significantly lower than any heretofore attainable under any steady power conditions.

Further objects and advantages of the invention will become apparent from the following detailed description thereof and the features of novelty which characterize the invention will be pointed out with particularity in the claims annexed to and forming part of this specification.

In the practice of the present invention, there is employed a thermoelectric cooling device including one or more thermoelectric elements each having a hot junction and a cold junction and a thermal mass in heat exchange relationship with the hot junction having a heat storage capacity of sufficient magnitude so that the rate at which the hot junction reaches its final or steady state temperature for any given current condition substantially lags the rate at which the cold junction attains its final or steady state temperature condition. The current supplied to the thermoelectric element or elements is so controlled as to obtain a cold junction temperature significantly below that attainable by the flow of any steady current through the elements. More specifically, in accordance with the present invention, there is first passed through the thermoelectric elements a direct current of the optimum value, that is, a current which would provide the minimum cold junction temperature over a continuing period of time. After the steady-state condition has been obtained with optimum current, the current supplied to the thermoelectric element is gradually increased. With higher than optimum current the cold junction temperature will first decrease, but as soon as the corresponding increase in hot junction temperature has its effect felt on the cold junction temperature, the cold junction temperature begins to increase. At this instant, the current is increased again, and as initially, the cold junction temperature will decrease once more. This process when reported will continually reduce the cold junction temperature until the electrical current has been increased to a value where (from Equation #2)

$$(\alpha_A-\alpha_B)T_CI=\frac{1}{2}I^2R+Q_0$$

An increase of current beyond this value produces a heating rather than a cooling effect at the cold junction.

The larger the aforementioned thermal mass in heat exchange relationship with the hot junction the longer will be the time before the hot junction temperature will increase to its steady state value; consequently, the longer will be the lapse of time before the cold junction temperature will begin to rise with a given current value and the greater the reduction in cold junction temperature.

By this procedure, there is ultimately obtained a cold junction temperature which is significantly lower than any cold junction temperature obtainable when a steady current of any value is passed through the elements.

Figure 2:
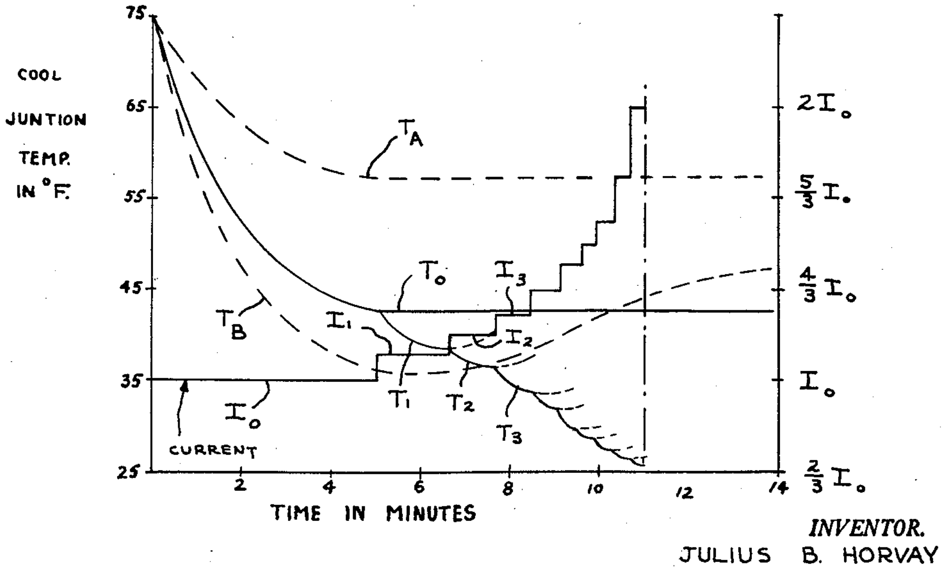

For a better understanding of the invention reference may be had to the accompanying drawing in which:

FIG. 1 is a schematic diagram of one type of apparatus and circuitry for carrying out the method of the present invention; and FIG. 2 is a plot of various characteristics of a thermoelectric element illustrating the results obtainable in accordance with the present invention.

As has been previously indicated, for any given thermoelement or thermocouple, one can calculate the optimum direct current value which will give the lowest continuous cold junction temperature. In other words, there is an optimum current that will provide the maximum cooling effect for a prolonged or indefinite period of time. With reference to FIG. 2 of the drawing, the curve $T_0$ is representative of the operation of a particular thermoelectric element when the optimum current $I_0$ is passed through the element. It will be noted that when the current is first passed through the element which is initially at room temperature, the temperature of the cold junction drops for a period of time and then after about five minutes it levels off as indicated by the horizontal portion of this curve. This particular element operating in an ambient of 75° ultimately had a cold junction temperature of about 43° F. While not shown, the hot junction in heat exchange with a substantially thermal mass exhibited a corresponding but less substantial increase in temperature from the ambient of 75° F. to a maximum steady value of about 85° F.

It is well known that when a current of a smaller value than the optimum is passed through a thermoelectric element, the final cold junction temperature is not as low and the hot junction temperature not as high as when the optimum current is applied. With reference to FIG. 2 of the drawing the curved labelled $T_A$ shows the operation of the same thermoeelctric element at a current value two-thirds the optimum. It will be noted that the cold junction temperature does reach a steady state value and maintains that value indefinitely. However, the steady state cold junction temperature is much higher than with the optimum current. At the same time the hot junction temperature increased from the initial ambient of 75° F. to a maximum of about 80° F.

When a current larger than the optimum is passed through the element, there is initially a much faster decrease in the temperature of the cold junction to an ultimate temperature which is lower than that obtained with the optimum current. However, thereafter, the heat conductance from the hot junction and the $I^2R$ heat generated in the thermoelectric element cause an increase in the cold junction temperature. This effect is illustrated by the dotted curve $T_B$ in FIG. 2 showing that with a current 1⅓ times the optimum, a temperature lower than that produced by the optimum current was obtained shortly after energization of the element but that the ultimate temperature of the cold junction was higher than that obtained with the otpimum current. At this current value, the hot junction temperature ultimately reached a temperature of approximately 130° F.

The present invention is based on the discovery that a cold junction temperature lower than any obtainable at any time by passing a current of a given value through the thermoelectric element can be attained by first applying to the thermoelectric element the optimum current until such time as the cold junction has reached approximately its steady state temperature and thereafter increasing the current at such a rate that the transient response of the cold junction Peltier effect is at a faster rate than the counteracting effect of thermo-conductivity from the hot junction to the cold junction.

The rate at which the current is increased to obtain this lower temperature is dependent upon the rate at which the temperature of the hot junction increases with the increased current flow. This requirement will be better understood by reference to Equation 2 showing that if the second term on the right hand side of the equation increases faster than the hot junction temperature, the cold junction temperature will be reduced. In order to prevent the change in the hot junction temperature from following closely the temperature change obtained at the cold junction temperature or, in other words, in order to cause the hot junction temperature to lag that which would ultimately be obtained as a result of passing a given increased current through the thermoelectric element, the hot junction is provided with a relatively large thermal mass capable of absorbing much of the increased heat generated at the hot junction and, for a period of time, preventing some of that heat from flowing to the cold junction. With reference again to Equation 2, it will be seen that a thermal mass in heat exchange relationship with the hot junction which is capable of causing the hot junction to increase its temperature with increased current at a slower than normal rate, the increase in current will cause the hot junction temperature $T_h$ to lag the increase in the Peltier cooling power $(\alpha_A-\alpha_B)\ T_cI$ with the result that the net cooling power of the element increases.

While the current can be gradually increased in the practice of the present invention in either a continuous or stepwise manner, the invention will best be understood when considered in the application thereof by incremental or stepwise increases in the current above the optimum value. The effect on the cold junction temperature of such gradually increasing of the current is shown by curves $T_1$, $T_2$, $T_3$, etc., which together are wavy continuations of the sloping portion of curve $T_0$. Each of these curves $T_1$, $T_2$, etc., are of about the same shapes but much shorter than the curved portion of curve $T_0$. Also plotted in FIG. 2 are the values of the current flowing through the thermoelectric element at a given time with the stepped increases in the current labelled $I_1$, $I_2$, $I_3$, etc., respectively representing the current flow producing the cold junction temperature changes $T_1$, $T_2$, $T_3$, etc., resulting therefrom. In other words, the first increase in the value of the current passing through the element indicated by the first step $I_1$ results in a decrease in the temperature of the cold junction as indicated by the curve $T_1$. As soon as this portion of the curve $T_1$ begins to level off indicating that the maximum cooling effect for the current value $I_1$ has been obtained and that thereafter the cooling effect thereof will be more than offset by heat leakage from the hot junction which has experienced a corresponding increase in temperature, the current is again increased to the next step $I_2$ to provide a further decrease in the cold junction temperature as indicated by the curve $T_2$. As this curve $T_2$ gradually levels off, the current is again increased to the value $I_3$ with the result that there is an additional decrease in the temperature of the cold junction represented by $T_3$. The remaining unlabelled current steps cause corresponding decreases in the cold junction tempertaure. The upwardly curved dotted line extensions of the curves $T_1$, $T_2$, $T_3$ and the remaining segments each indicate the temperature which the cold junction would follow due primarily to heat leakage from the hot junction if there had been no succeeding increase in the current.

The results obtained in accordance with the present invention can also be described with reference to Equation 2 taking into consideration the fact that by employing a heat sink or high thermal mass in heat exchange relationship with the hot junction, its temperature lags behind that which would result in the absence of the thermal mass. For each increase in current, there is an increase in the Peltier cooling as represented by the term $(\alpha_A - \alpha_B)T_cI$. This takes place in spite of the fact that this increased cooling effect is being partially offset by the $I^2R$ heat generated in an adjacent cold junction and is realized until such time as the temperature of the hot junction increases to the point that the heat conducted from the hot junction equals or offsets the increased cooling effect.

In other words a significantly reduced cold junction temperature is obtained by providing a hot junction with a large thermal mass and then, after reaching steady state conditions with the optimum current, gradually increasing the current at such a rate that the hot junction temperature never reaches its steady state value for the current flowing through the thermoelectric element at a given time. In effect, the cold junction will see a cooler hot junction temperature than would be the case under steady state conditions.

The limiting low temperature obtainable in accordance with the present invention depends upon the limitations of the thermal mass at the hot junction and the fact that the net cooling power reduces even under steady current conditions as the current is increased beyond the optimum. In other words the larger the current the more quickly will the increased $I^2R$ heat make its influence felt at the cold junction thereby counteracting the Peltier effect.

As shown by FIG. 2 of the drawing each increment of increase of the current $I_1$, and $I_2$, etc., requires a dwell time at each step which becomes shorter as the current becomes larger. The reason for this is that the hot junction is continuously increasing in temperature as the result of each increase in the current value and is gradually reaching the saturation point for the heat sink. However, as is seen from a comparison for example of a curve $I_0$ which provides a minimum temperature of about 45° F., there is nevertheless obtainable for a period of time a relatively low temperature which in the subject example approached 25° F. This temperature which is substantially lower than any obtainable by passing a steady current through the thermoelectric element can be obtained after any mass being cooled by the cold junction has been cooled to the lowest temperature obtainable with the optimum current value.

While any suitable apparatus may be employed to carry out the method of the present invention, there is shown somewhat schematically in FIG. 1 one type of apparatus including a first transformer 1 including a primary winding 2 and a second winding 3 connected to the power supply unit 4 designed to supply a direct current to the thermoelectric cooling device 5. The thermoelectric cooling device 5 comprises two thermoelectric elements each having a cold junction 6. A pan 7 resting in heat exchange relationship for the cold junction 6 is illustrative of the load to be cooled by the thermoelectric cooling device.

In order to provide a direct current to the thermoelectric cooling element 5, the power supply 4 comprises a combination transformer and rectifier including a primary transformer winding 8, a secondary winding 9 and 10 respectively connected through the rectifiers 11 and 12 to the thermoelectric elements in the well-known manner.

In order to provide for a gradual increase in the current supply to the thermoelectric cooling device 5, the primary winding 8 is connected to the secondary winding 3 of the transformer 1 through a commutator 12 including a plurality of segments of decreasing lengths each tapped to a different portion of secondary winding 3. More specifically the commutator comprises a first segment 14 for supplying the optimum current, a second segment 15 for supplying the increased current represented by $I_1$, a third segment 16 for further increasing the current supply to the $I_2$ value and so forth. It is to be understood that the arm 17 of the commutator 12 is driven by a suitable timer motor or the like so that the arm will pass from segment to segment at the required rate. The commutator also includes a segment 18 which is not connected to the transformer secondary winding 3 and which is provided for the purpose of de-energizing the cooling device 5 when the temperature of the cold junction has reached the minimum. This is necessary in order to permit the hot junction to return to its initial or ambient temperature condition or at least to the temperature exhibited thereby with the optimum current flow. Also, it will be seen that as the arm 17 rotates from segment 14 delivering the optimum current to the cooling device 5 first to the segment 14 and then to the other segments there is a gradual increase in the current delivered to the thermoelectric elements and also a gradual decrease in the length of time that each increased increment of current is so supplied. The decrease in the total time for each increase in current value assures that the current will increase at a rate faster than the increase in the temperature of the hot junction.

It will be appreciated of course that apparatus other than that shown in FIG. 1 can be employed in carrying out the method of the present invention and that in fact the invention is not limited to any particular apparatus. It is intended therefore by the appended claims to cover the method of the present invention and/or modifications thereof within the true spirit and scope of the invention.

What I claim as new and desire to secure by Letters Patent of the United States is:

1. The method of operating a thermoelectric cooling device including a thermoelectric element having a cold junction and a hot junction and a thermal mass in heat exchange relation with said hot junction, which method comprises the steps of passing through said element a direct current of the value substantially equal to that providing the minimum temperature obtainable continuously at said cold junction under steady current conditions, continuing the passage of said current for a period of time at least sufficient to obtain said minimum cold junction temperature and a steady hot junction temperature, and thereafter gradually increasing the current supplied to said element at a rate such that the hot junction does not reach a steady state value for the current being supplied to said element at any given time.

2. The method of claim 1 in which the current is increased in a plurality of steps and each succeeding stepwise increase in the current is made after the current then flowing through said element has effected a maximum decrease in the cold junction temperature but before it has effected a full increase in the hot junction temperature.

References Cited in the file of this patent

UNITED STATES PATENTS 2,998,707 Meess ---------------- Sept. 5, 1961